(12) United States Patent
Dhindsa et al.

(10) Patent No.: US 7,405,521 B2
(45) Date of Patent: Jul. 29, 2008

(54) MULTIPLE FREQUENCY PLASMA PROCESSOR METHOD AND APPARATUS

(75) Inventors: Raj Dhindsa, San Jose, CA (US); S. M. Reza Sadjadi, Saratoga, CA (US); Felix Kozakevich, Sunnyvale, CA (US); Dave Trussell, Fremont, CA (US); Lumin Li, Fremont, CA (US); Eric Lenz, Pleasanton, CA (US); Camelia Rusu, Fremont, CA (US); Mukund Srinivasan, Fremont, CA (US); Aaron Eppler, Fremont, CA (US); Jim Tietz, Fremont, CA (US); Jeffrey Marks, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 616 days.

(21) Appl. No.: 10/645,665

(22) Filed: Aug. 22, 2003

(65) Prior Publication Data

US 2005/0039682 A1  Feb. 24, 2005

(51) Int. Cl.
*H01J 7/24* (2006.01)
*C23F 1/00* (2006.01)
*C23C 16/00* (2006.01)

(52) U.S. Cl. .......................... 315/111.21; 315/111.81; 156/345.28; 118/723 R

(58) Field of Classification Search ................. 315/111.21–111.91; 250/423, 423 R; 118/723, 118/723 R, 723 E; 156/345.43–345.47, 345.28
See application file for complete search history.

(56) References Cited

U.S. PATENT DOCUMENTS

| | | | | |
|---|---|---|---|---|
| 4,963,242 A | * | 10/1990 | Sato et al. ............. | 204/298.31 |
| 5,534,751 A | * | 7/1996 | Lenz et al. ............. | 315/111.71 |
| 5,556,549 A | | 9/1996 | Patrick et al. ............ | 216/61 |
| 5,688,330 A | * | 11/1997 | Ohmi ..................... | 118/723 E |
| 5,716,534 A | | 2/1998 | Tsuchiya et al. | |
| 5,846,885 A | | 12/1998 | Kamata et al. | |
| 5,897,713 A | | 4/1999 | Tomioka et al. .......... | 118/723 I |
| 5,982,099 A | * | 11/1999 | Barnes et al. ............ | 315/111.21 |
| 6,071,372 A | | 6/2000 | Ye et al. .................. | 156/345.48 |
| 6,127,278 A | | 10/2000 | Wang et al. ............ | 438/719 |
| 6,153,068 A | | 11/2000 | Ohmi et al. ............ | 204/298.06 |
| 6,303,510 B1 | | 10/2001 | Chien et al. ............ | 438/710 |
| 6,309,978 B1 | * | 10/2001 | Donohoe et al. .......... | 438/710 |
| 6,344,419 B1 | * | 2/2002 | Forster et al. ........... | 438/758 |
| 6,350,701 B1 | * | 2/2002 | Yamazaki ................. | 438/732 |
| 6,387,287 B1 | | 5/2002 | Hung et al. ............... | 216/67 |
| 6,433,297 B1 | | 8/2002 | Kojima et al. ........... | 219/121.43 |
| 6,485,602 B2 | | 11/2002 | Hirose .................... | 156/345.44 |
| 6,506,674 B2 | | 1/2003 | Ikeda et al. ............. | 438/637 |
| 6,524,432 B1 | | 2/2003 | Collins et al. .......... | 156/345.48 |

(Continued)

*Primary Examiner*—Thuy Vinh Tran
*Assistant Examiner*—Tung X Le
(74) *Attorney, Agent, or Firm*—Lowe Hauptman Ham & Berner LLP

(57) ABSTRACT

A workpiece is processed with a plasma in a vacuum plasma processing chamber by exciting the plasma at several frequencies such that the excitation of the plasma by the several frequencies simultaneously causes several different phenomena to occur in the plasma. The chamber includes central top and bottom electrodes and a peripheral top and/or bottom electrode arrangement that is either powered by RF or is connected to a reference potential by a filter arrangement that passes at least one of the plasma excitation frequencies to the exclusion of other frequencies.

45 Claims, 5 Drawing Sheets

U.S. PATENT DOCUMENTS

| | | | |
|---|---|---|---|
| 6,727,654 B2 * | 4/2004 | Ogawa et al. | 315/111.01 |
| 6,727,655 B2 * | 4/2004 | McChesney et al. | 315/111.21 |
| 6,849,154 B2 * | 2/2005 | Nagahata et al. | 156/345.47 |
| 6,853,141 B2 * | 2/2005 | Hoffman et al. | 315/111.21 |
| 2001/0009139 A1 * | 7/2001 | Shan et al. | 118/723 E |
| 2002/0139665 A1 | 10/2002 | DeOrnellas et al. | |
| 2003/0062344 A1 * | 4/2003 | Hoffman et al. | 219/121.43 |
| 2003/0178140 A1 * | 9/2003 | Hanazaki et al. | 156/345.28 |
| 2004/0000875 A1 * | 1/2004 | Vahedi et al. | 315/111.71 |
| 2005/0022933 A1 * | 2/2005 | Howard | 156/345.47 |
| 2006/0175015 A1 * | 8/2006 | Chen et al. | 156/345.44 |

* cited by examiner

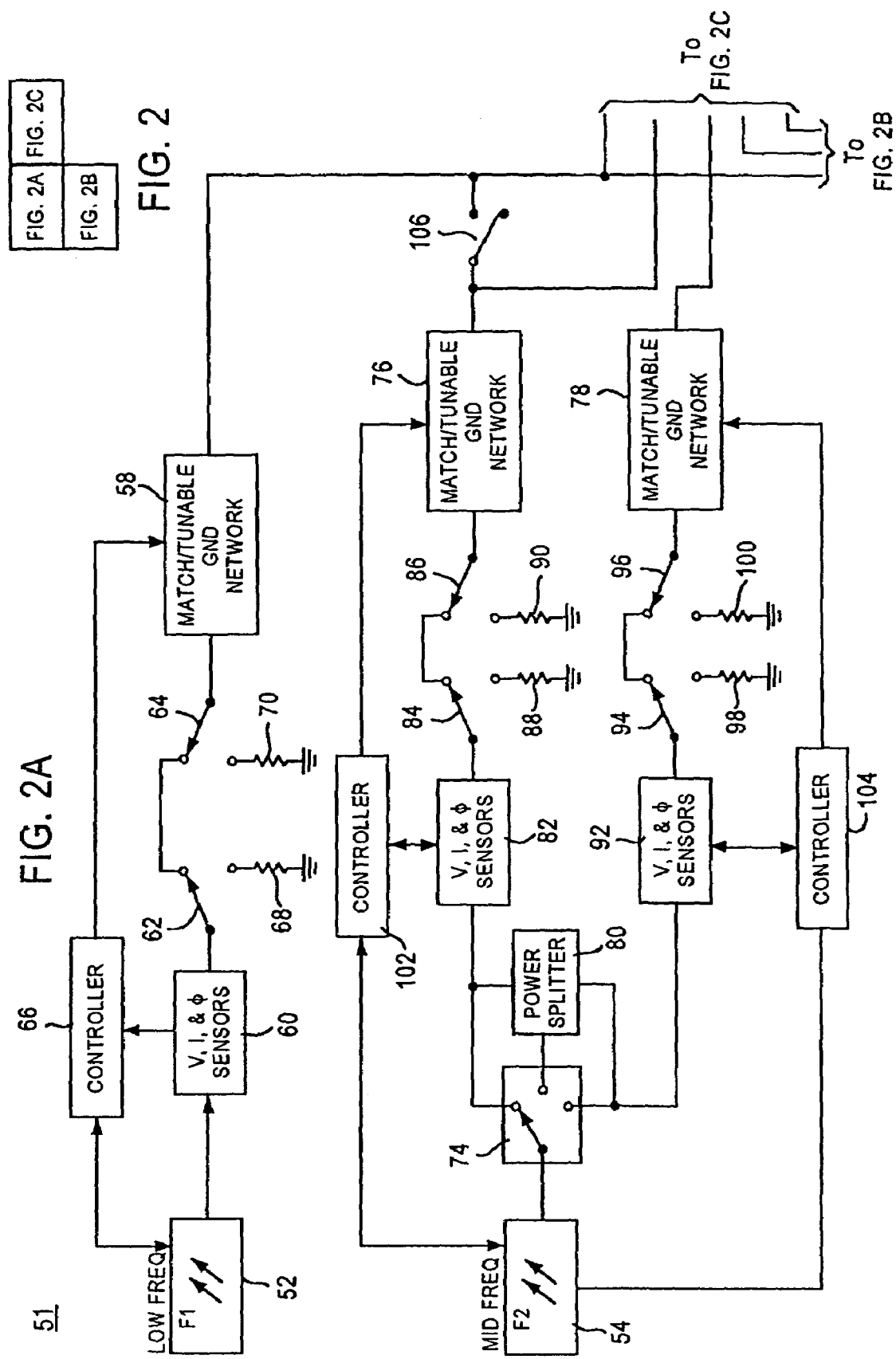

MULTIPLE FREQUENCY PLASMA PROCESSOR METHOD AND APPARATUS

TECHNICAL FIELD

The present invention relates generally to a method of and apparatus for processing a workpiece with a plasma in a vacuum plasma processing chamber. According to one particular aspect of the invention electric energy at several (i.e., three or more, but not many) frequencies can be applied to the plasma. According to another aspect of the invention the chamber includes central top and bottom electrodes and a peripheral top and/or bottom electrode arrangement that is either powered by RF or is connected to a reference potential by a filter arrangement that passes at least one of the plasma excitation frequencies to the exclusion of the other frequencies.

BACKGROUND ART

It is known to apply plasma excitation fields at two different frequencies to a region of a vacuum chamber for plasma processing a workpiece, wherein the region is coupled to a gas that the fields convert into the processing plasma. The workpiece is usually a semiconductor wafer, or dielectric plate and the plasma is involved in forming integrated circuit features on the workpiece. Typically, the plasma excitation fields at the two different frequencies are supplied to the region by a pair of spaced electrodes in the chamber or one electrode in the chamber and a reactance, in the form of a coil, located outside the chamber. The excited plasma typically dry etches the workpiece, but in some instances results in materials being deposited on the workpiece. High frequency RF power (having a frequency in excess of approximately 10 MHz) typically controls the density of the plasma, i.e., the plasma flux, while RF power having a low to medium frequency (in the range of 100 kHz to approximately 10 MHz) typically controls the energy of ions in the plasma and incident on the workpiece.

As the size of the features continues to decrease, there are increased requirements for precise control of various parameters of the plasma processing a workpiece. Amongst the plasma parameters requiring precise control are the plasma chemistry (i.e., types of ionic and radical species), the plasma flux and the ion energy of the plasma incident on the substrate. With the shrinking feature sizes and use of new materials in fabrication of integrated circuits, windows involved in processing the workpiece are decreasing in size, while pushing the limits on presently available plasma processors, particularly processors for etching. The shrinking feature sizes and requirements for new materials limit the use of the same reactor, i.e., vacuum processing chamber, for different etch applications.

It is, accordingly, an object of the present invention is to provide a new and improved method of and apparatus for processing a workpiece with a plasma.

Another object of the invention is to provide a new and improved method of and apparatus for precisely controlling several parameters of a plasma for processing a workpiece.

An additional object invention is to provide a new and improved method of and apparatus for precisely controlling the chemistry, density and ion energy of a plasma for processing a workpiece.

A further object of the invention is provide a new and improved highly versatile plasma processor for precisely controlling two or more parameters of a plasma for processing a workpiece.

SUMMARY OF THE INVENTION

In accordance with one aspect of the present invention, a workpiece is processed with a plasma in a vacuum plasma processing chamber by exciting the plasma with electric energy at several frequencies such that excitation of the plasma by the several frequencies simultaneously causes several different phenomena to occur in the plasma.

The method preferably further comprises selecting various combinations of these frequencies to affect combinations of the plasma density, the energy of ions in the plasma, and the degree of fragmentation of the molecules of the plasma, i.e., the plasma chemistry. In a preferred embodiment, the first frequency is in the range of 100 kHz to 10 MHz, the second frequency is in the range of 10 MHz to 150 MHz, and the third frequency is in the range of 27 MHz to 300 MHz. In one specific arrangement wherein the low, medium and high frequencies are respectively 2 MHz, 27 MHz and 60 MHz and have the same effective power and are selectively applied to a particular plasma mixture, the relative effects of the frequencies on the gas mixture and resulting plasma are in accordance with Table I.

TABLE I

| 2 MHz | 27 MHz | 60 MHz | Ion Energy | Plasma Density | Degree of Plasma Fragmentation |
|---|---|---|---|---|---|
| ✓ | ✓ | ✓ | High | High | Medium & High |
| ✓ | ✓ | — | High | Medium | Medium |
| ✓ | — | ✓ | High | High | High |
| — | ✓ | ✓ | Medium | High | Medium & High |
| ✓ | — | — | High | Low | Low |
| — | ✓ | — | Medium | Medium | Medium |
| — | — | ✓ | Low | High | High |

In Table I, a (✓) and (-) respectively indicate a particular frequency is applied and is not applied to the plasma. From Table I, the application of 27 MHz and 60 MHz causes medium fragmentation of certain molecules and high fragmentation of other molecules, the application of 2 MHz causes high ion energy, the application of 60 MHz results in high plasma density, and various other combinations of frequencies result in various combinations of the three plasma phenomena.

Another aspect of the present invention relates to an apparatus for processing a workpiece with a plasma, wherein the apparatus comprises a vacuum chamber for processing the workpiece with the plasma, and means for exciting the plasma with electric energy at several frequencies such that the excitation of the plasma by the several frequencies simultaneously causes several different phenomena to occur in the plasma.

An additional aspect of the invention relates to a vacuum plasma processor comprising a vacuum chamber that includes an electrode and is associated with a reactance. The electrode and reactance are arranged for coupling plasma excitation fields to gas in the chamber that is arranged to carry the workpiece. A plasma excitation source arrangement enables the electrode and reactance to couple electric energy at several frequencies to the plasma, such that the frequencies can cause several different phenomena to occur simultaneously in the plasma.

A further aspect of the invention concerns a vacuum plasma processor for a workpiece comprising a vacuum chamber including first and second electrodes for supplying plasma excitation electric fields to a region of the chamber adapted to be responsive to gas that is converted into a plasma for processing the workpiece. The chamber is arranged for carrying the workpiece. A plasma excitation source arrangement derives electric energy at several frequencies and includes circuitry for selectively enabling coupling of the several frequencies to the first and second electrodes.

Yet a further aspect of the invention relates to a vacuum plasma processor for processing a workpiece comprising a vacuum chamber including an electrode arrangement for supplying plasma excitation fields to a region of the chamber adapted to be responsive to gas adapted to be converted into a plasma for processing the workpiece, wherein the electrode arrangement includes first and second electrodes respectively on opposite first and second sides of the region and a third electrode on the first side of the region. The third electrode is peripheral to and electrically insulated from the first electrode. A plasma excitation source arrangement for deriving electric energy at plural frequencies is arranged for selectively coupling energy at the plural frequencies to the first, second and third electrodes for causing current at at least one of the plural frequencies to flow in the third electrode without current at all the frequencies flowing through the third electrode.

Still an additional aspect of the invention relates to a method of processing a workpiece in a vacuum plasma processor including a vacuum chamber including an electrode arrangement for supplying plasma excitation fields to a region of the chamber responsive to gas that is converted into a plasma that processes the workpiece, wherein the electrode arrangement includes first and second electrodes respectively on opposite first and second sides of the region and a third electrode on the first side of the region. The third electrode is peripheral to and electrically insulated from the first electrode. The method comprises coupling energy at plural frequencies to the first, second and third electrodes so that current at at least one of the plural frequencies flows in the third electrode without current at all the frequencies flowing through the third electrode.

Preferably, the electrode arrangement includes a fourth electrode on the second side of the region. The fourth electrode is peripheral to and electrically insulated from the second electrode. The energy is selectively coupled to the fourth electrode so current at at least one of the plural frequencies flows in the fourth electrode without current at all the frequencies flowing in the fourth electrode.

In certain embodiments, energy is selectively coupled to the third and/or fourth electrodes by connecting to the third and/or fourth electrodes a power source arrangement having at least one of the frequencies. In other embodiments, energy is selectively coupled to the third and/or fourth electrodes by connecting between the third and/or fourth electrodes and a reference potential a filter arrangement that passes at least one of the frequencies and blocks at least one of the frequencies.

In a preferred embodiment, the several frequencies are simultaneously applied to the plasma. It is to be understood, however, that the several different phenomena can simultaneously occur in the plasma if at least one of the several frequencies is pulsed on and off.

The plasma excitation source arrangement is, in one embodiment, arranged for applying a plurality of the frequencies to the first electrode and at least one of the frequencies to the second electrode.

In a second embodiment, the plasma excitation source arrangement is arranged for applying several of the frequencies to the first electrode. In this embodiment, the second electrode is preferably connected to a reference potential, e.g., at RF and DC ground.

Preferably, the plasma excitation source arrangement includes circuitry for (a) providing an impedance match between sources of the frequencies and the plasma and (b) decoupling the frequencies associated with a plurality of the different sources from each of the other sources.

The plasma excitation source arrangement can include at least one variable frequency RF source, at least one fixed frequency RF source, and at least one variable power RF source.

Preferably, the circuitry and the chamber arrangement are arranged for preventing substantial current to flow at at least one of the plurality of frequencies to the second electrode. To this end, the circuitry and chamber are such that a surface in the chamber is at a reference potential for causing current to flow at at least one of the plurality of frequencies from the first electrode to the surface and the circuitry includes a filter arrangement connected to the second electrode for (a) preventing the substantial flow of current at at least one of the plurality of frequencies between the second electrode and the reference potential and/or (b) enabling the substantial flow of current at at least one of the plurality of frequencies between the electrodes and the reference potential.

To assist in providing the desired versatility, the circuitry includes a control arrangement for selectively connecting the second electrode to a reference potential during a first time period while a first type of plasma processing is occurring and for selectively supplying the same frequency to the first and second electrodes during a second period while a second type of plasma processing is occurring. Further, the control arrangement is arranged for selectively connecting the first electrode to be responsive to each of the several frequencies during the first time period to obtain greater versatility.

To maintain the plasma in a small volume and thereby provide fast and active pressure control, the plasma is preferably confined to a region removed from sidewalls of the chamber and bounded by first and second opposite electrodes. The resulting small plasma volume leads to lower cost of consumable materials in the chamber and facilitates cleaning of the chamber, i.e., reactor. To assist in controlling the plasma in the region, the pressure of the plasma in the region is preferably maintained at a set point by a feedback arrangement.

Spacing may be varied between a pair of opposed plasma excitation electrodes in the chamber to provide process optimization at the different plasma excitation frequencies.

The power of at least one of the several frequencies is preferably varied to provide a wider window for process optimization and produce suitable plasma chemistry, ion flux and ion energy distribution.

Preferably, the plasma is excited by a pair of opposed electrodes and power at at least one of the several frequencies is coupled to at least one of the electrodes. Power coupled to the at least one of the electrodes at the one of the several frequencies is coupled to RF ground to provide independent control of the ion energy on each electrode and the plasma density.

Controlling the temperatures of the opposed electrodes while the workpiece is being processed process enables results to be optimized, particularly by tailoring deposition of polymer in photoresist or other films being etched by the plasma.

The above and still further objects, features and advantages of the present invention will become apparent upon consideration of the following detailed descriptions of several specific embodiments thereof, especially when taken in conjunction with the accompanying drawings.

DETAILED DESCRIPTION OF THE DRAWINGS

Figure 1:
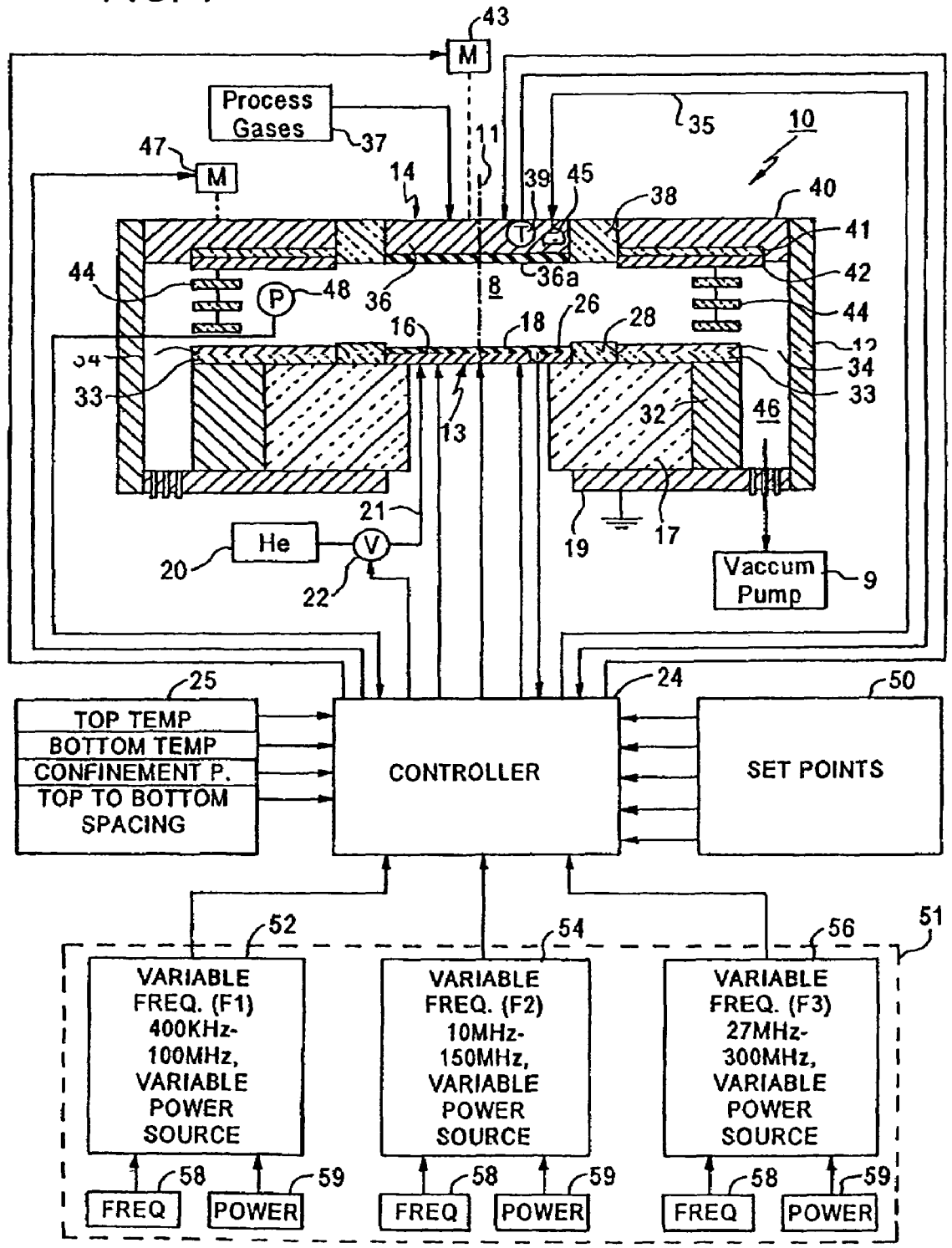
FIG. 1 is a partially schematic diagram of a vacuum plasma processor in accordance with a preferred embodiment of the present invention.

Reference is now made to FIG. 1 of the drawing wherein plasma processor vacuum chamber 10, having longitudinal axis (i.e., centerline) 11 is illustrated as including electrically conductive metal wall 12, bottom electrode assembly 13 and top electrode assembly 14. Wall 12 has a circular inner periphery, coaxial with axis 11. Wall 12 is grounded, i.e., at DC and RF reference potentials. Vacuum pump 9 maintains the interior of chamber 10 at a vacuum on the order of 0.001 to 500 torr during processing. The interior of chamber 10 includes confined plasma region 8 between a bottom boundary close to the top face of bottom electrode assembly 13 and a top boundary close to the bottom face of top electrode assembly 14; the side boundary of confined plasma region 8 is spaced from wall 12.

Bottom electrode assembly 13, frequently referred to as a bottom electrode, is coaxial with axis 11 and is secured to electric insulating ring 17, which in turn is secured to metal, grounded base 19 of chamber 10. Electrode assembly 13 includes circular, central metal electrode 16 that is coaxial with axis 11 and has an upper surface for receiving a circular workpiece 18, typically a semiconductor wafer having a diameter substantially equal to the diameter of metal electrode 16. When workpiece 18 is properly in place its center is coincident with axis 11. Electrode 16 can be connected to a DC chucking voltage source (not shown) for clamping workpiece 18 to electrode 16 using electrostatic forces. The temperature of electrode 16 and workpiece 18 are controlled in a manner known to those skilled in the art by connecting helium source 20 to a region (not shown) in electrode 16 by way of conduit 21 and valve 22, responsive to an electric signal that controller 24 derives in response to (1) a temperature set point supplied to the controller by set point source 25 and (2) a measure of the temperature in the electrode, as indicated by a signal derived by temperature monitor 26 embedded in electrode 16.

Bottom electrode assembly 13 also includes electric insulator ring 28, typically made of quartz. Ring 28 is secured to the top face of insulator ring 17, is coaxial with axis 11 and has an inner diameter substantially equal to the diameter of workpiece 18 so that the periphery of workpiece 18, when the workpiece is properly in place, almost abuts the inner periphery of ring 28. The portion of the top face of ring 17 outside ring 28 and the side wall of ring 17 are covered by insulator ring 33 and grounded metal ring 32, respectively. Insulating ring 33 is overlaid by metal electrode ring 34 that can be covered or coated with a layer (not shown) of dielectric or conductive material. Electrically conductive ring 34 and the layer that covers or coats it are made of a material that does not contaminate the chemistry of the plasma in region 8. Such a material is a suitable relatively high conductivity semiconductor, e.g., intrinsic silicon. Alternatively, ring 34 is a metal covered by a suitable non-contaminating material. Ring 34 is electrically insulated from grounded metal ring 32 by dielectric, insulating ring 33 under certain circumstances and electrically connected to grounded ring 32 under other circumstances. Rings 33 and 34 are coaxial with axis 11, and extend horizontally between the outer edge of bottom electrode assembly 13 and ring 28.

Top electrode assembly 14 includes central electrode 36, coaxial with axis 11 and having a bottom face 36a made of electrically conductive intrinsic silicon that does not contaminate the chemistry of the plasma in region 8. Electrode 36 includes internal passages (not shown) and numerous showerhead openings (not shown), both connected in fluid flow relation to a suitable source 37 of process gases that flow through the showerhead openings into region 8 where the gases are converted into a plasma that processes workpiece 18. Electrode 36 includes a heating and/or cooling arrangement 45 responsive to an electric signal that controller 24 supplies to arrangement 45 via lead 35 in response to a set point signal supplied to the controller by set point source 25, as well as a signal indicative of the temperature of electrode 36, as derived by temperature gauge 39, embedded in assembly 14.

Assembly 14 also includes insulator ring 38 and metal ring 40. Ring 38 is coaxial with axis 11, preferably made of quartz and approximately aligned with ring 28. Ring 38 has an inner periphery abutting the outer periphery of central electrode 36. Metal ring 40, coaxial with axis 11, has inner and outer peripheries respectively abutting the outer periphery of insulator ring 38 and the inner periphery of side wall 12 so that ring 40 is at RF and DC ground potential. The lower, inner face of metal ring 40 is covered by electrical insulating ring 41 that carries an electrically conductive electrode ring 42. Electrode ring 42 is either coated or covered with a layer (not shown) of conductive or insulating material that does not contaminate the chemistry of the plasma in region 8. Ring 42 is electrically insulated from ring 40 and wall 12 by ring 41 and a downwardly depending flange (not shown) of ring 41 under certain circumstances and is electrically connected to ring 40 and wall 12 under other circumstances.

From the foregoing, confined plasma region 8 has a top boundary determined by (1) the bottom face 36a of electrode 36, (2) the bottom face of insulator ring 38 and (3) the bottom face of electrode ring 42, and a bottom boundary determined (1) by the top face of workpiece 18 (when the workpiece is in place), (2) the top face of insulator ring 28 and (3) the top face of electrode ring 34. Motor 43 controls the spacing between the top and bottom boundaries of region 8 by moving the bottom face of top electrode assembly 14 up-and-down relative to the top face of bottom electrode assembly 13. Motor 43 responds to a signal from controller 24 to set the spacing between the faces of electrode assemblies 13 and 14 at an experimentally determined optimum value for the particular frequencies that excite the plasma processing of workpiece 18, as derived from set point source 50.

The sides of confined plasma region 8 are bounded by spaced, vertically stacked louvers 44, made of a material that does not contaminate the chemistry of the plasma in region 8. The louvers 44 are made of a material that is either electrically insulating (preferably a dielectric, such as quartz) or somewhat electrically conductive (e.g. silicon carbide) so that the louvers are electrically powered, or float electrically or are electrically grounded. Louvers 44 are such that no substantial amount of plasma flows through the slots between louvers 44. However, un-ionized gas in region 8 escapes through the slots between louvers 44 to region 46 in chamber 10 between wall 12 and ring 32 and is pumped from the interior of chamber 10 by pump 9 through suitable openings in base 19.

Louvers 44 are fixedly spaced from each other in the vertical direction by a suitable spacing arrangement (not shown) and are driven up and down relative to each other and to bottom assembly 13 by motor 47 to control the pressure in confined plasma region 8. The pressure in region 8 is controlled by a pressure set point that set point source 25 supplies to controller 24 and an output signal of pressure gauge 48 in region 8. Controller 24 responds to the pressure set point and the output signal of pressure gauge 48 to control motor 47, and thereby vary the spacing between the bottom face of the lowest louver 44 and the top face of electrode assembly 13. Consequently, the pressure in region 8 is maintained at the pressure set point. Louvers 44 are arranged so that the louvers do not move in response to activation of motor 43, so that the pressure in confined plasma region 8 is controlled independently of the spacing between electrode assemblies 13 and 14.

Controller 24 responds to set point source 50 to control coupling of various combinations of several different RF frequencies from source arrangement 51 to electrodes 16, 34, 36 and 42. The different RF frequencies applied to electrodes 16, 34, 36 and 42 can have different powers and control different phenomena of the plasma in confined region 8. In the embodiment of FIG. 1, controller 24 selectively applies up to three frequencies from source arrangement 51 to electrodes 16, 34, 36 and 42. Source arrangement 51 is illustrated as including three separate sources 52, 54 and 56 that can be fixed frequency sources, but are preferably low-power, variable frequency oscillators. Alternately source arrangement 51 includes a single low power synthesizer that can derive three selected frequencies. The low power sources drive associated variable power gain RF power amplifiers having variable frequency pass bands that are varied as the frequency of the source associated with a particular amplifier is varied. To this end, each of sources 52, 54 and 56 has an associated frequency and power setting 58 and 59. Typically, the frequency of source 52 is in a relatively low range between 100 kHz and 10 MHz, the frequency of source 54 is in a midrange between 10 MHz and 150 MHz, and the frequency of source 56 is in a relatively high range between 27 MHz and 300 MHz. In one actually tested arrangement, the frequencies of sources 52, 54 and 56 were respectively set at 2 MHz, 27 MHz and 60 MHz. Various combinations of the frequencies and the powers of the RF energy applied to region 8 affect the distribution of the density of plasma, the ion energy and the DC bias voltage of the plasma in confined region 8, and the chemistry of the plasma in region 8.

The frequencies of sources 54 and 56 control the chemistry of the plasma because greater dissociation of the plasma occurs as the plasma excitation frequency increases, if all other significant plasma excitation parameters remain constant. In particular, there is an increase in the percentage of lighter etchant molecules in the plasma as frequency increases. The high frequencies applied to the plasma result in greater molecular fragmentation.

Driving electrodes 16, 34, 36 and 42 with various combinations of frequencies and powers from sources 52, 54 and 56 enables the plasma to be tailored for various purposes, e.g., to provide uniform or non-uniform plasma density, ion energy and molecular fragmentation.

Controller 24 responds to output signals from set point source 50 and the RF outputs of source arrangement 51 to control the application of several frequencies from source arrangement 51 to electrodes 16, 34, 36 and 42 in various combinations and permutations. In a particular embodiment, set point source 50 activates controller 24 so (1) at least one of the frequencies, but up to all three frequencies, from sources 52, 54 and 56 drive electrode 16 while electrodes 34, 36, and 42 are grounded; (2) at least two of the frequencies from sources 52, source 54 and 56 drive electrodes 16 and 36 while electrodes 34 and 42 are grounded; (3) only one of sources 54 or 56 drives either electrode 16 or 36 or only source 52 drives electrode 16, while electrodes 34 and 42 are grounded; (4) electrode 34 is driven by source 52 and/or source 54 or is connected to ground via a filter having a pass band for the frequency of source 52 and/or source 54 (i.e., frequencies F2 and F3) while the remaining electrodes 16, 36, and 42 have various connections to sources 52, 54, and 56; and (5) electrode 42 is driven by source 52 and/or source 54 or is connected to ground via a filter having a pass band for the frequency of source 52 and/or source 54 (i.e., frequencies F2 and F3) while the remaining electrodes 16, 34, and 36 have various connections to sources 52, 54, and 56.

Figure 2B:
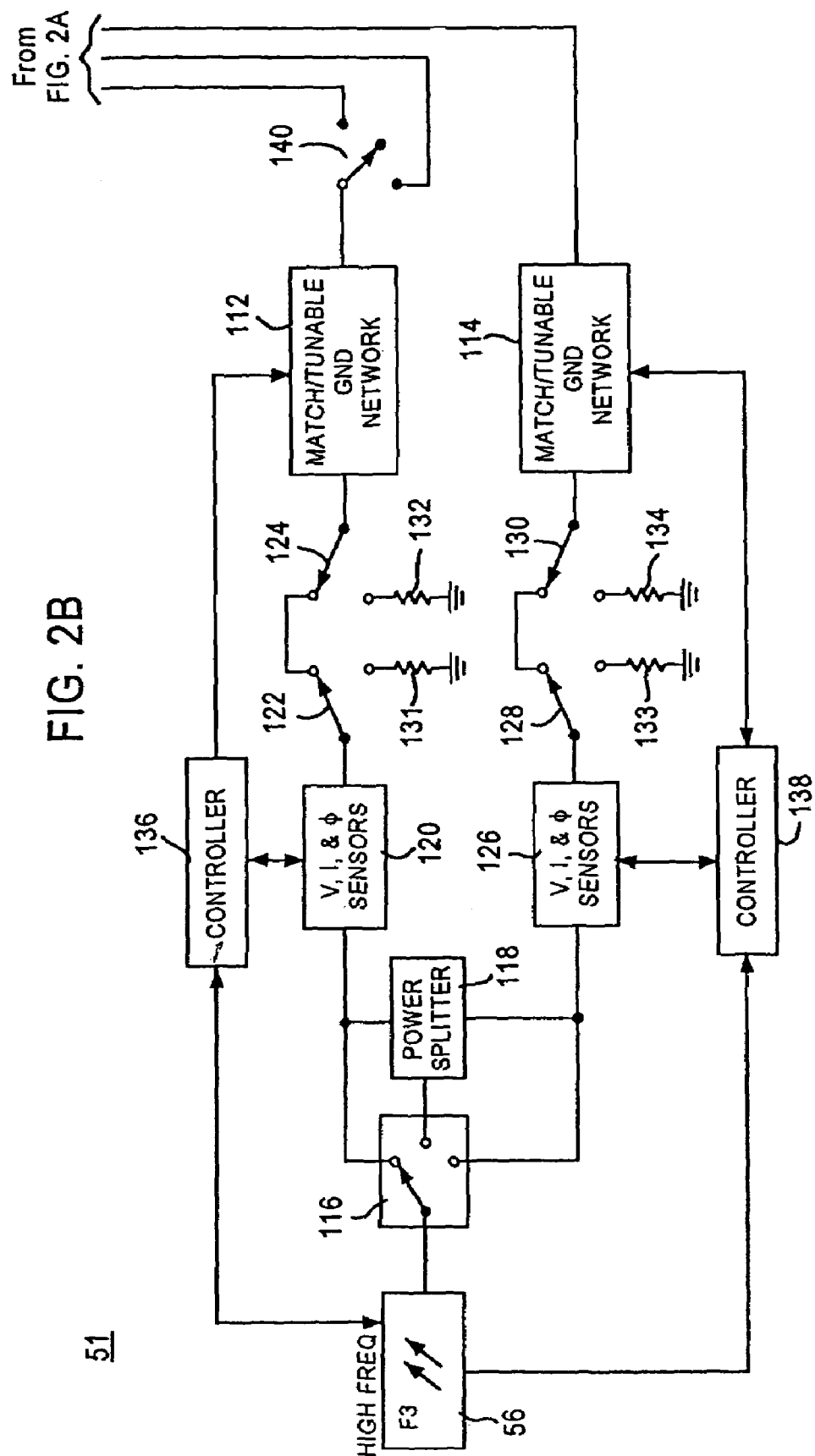
FIG. 2 is a block diagram of the electronic circuitry included in the controller of FIG. 1 in combination with a schematic representation of the electric parts of the vacuum processor chamber illustrated in FIG. 1.
Figure 2C:
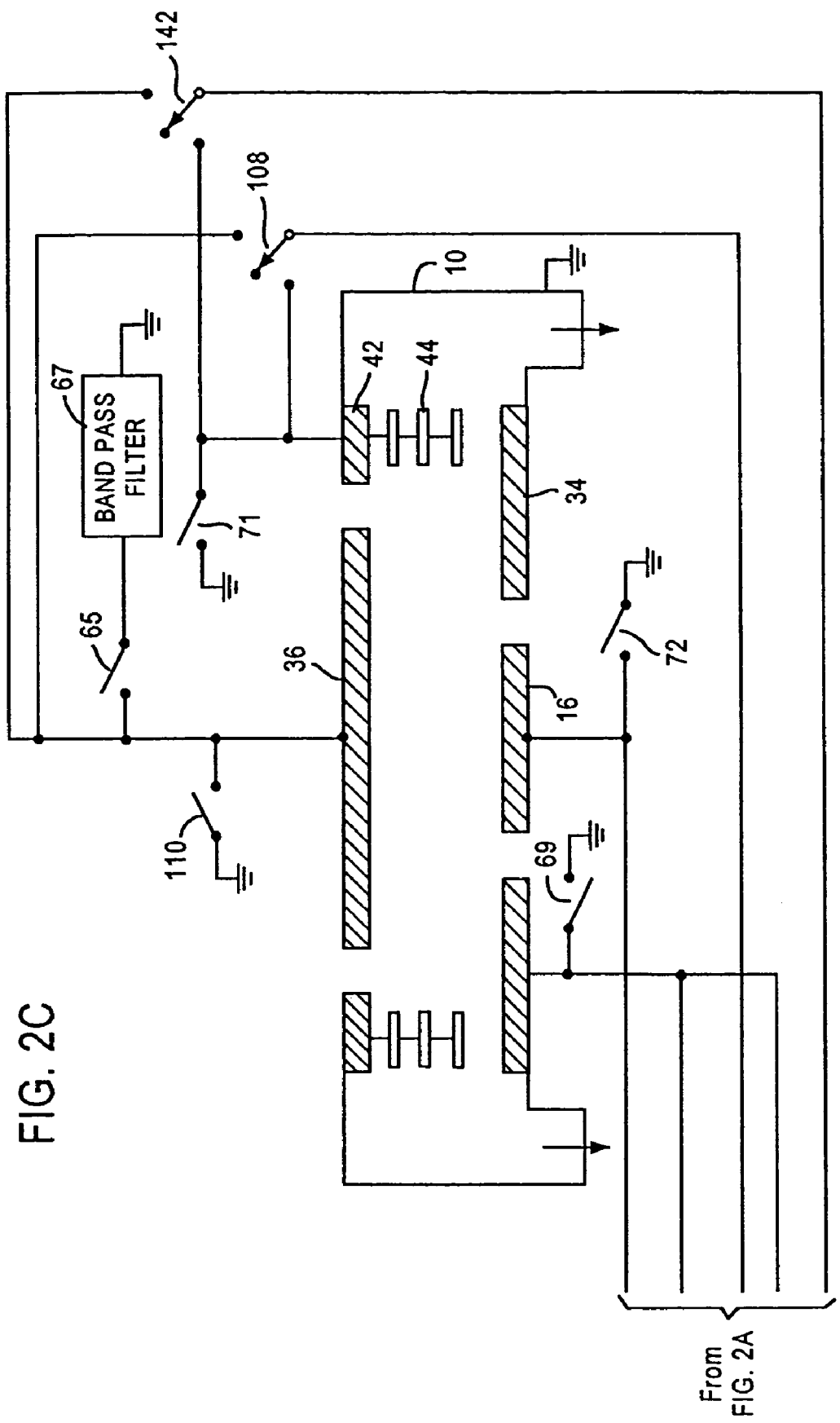

Reference is now made to FIG. 2 of the drawing, a block diagram including the circuitry of controller 24 for selectively coupling the output of sources 52, 54 and 56 to electrodes 16, 34, 36 and 42.

Low frequency source 52, having a frequency F1, drives only center electrode 16 of bottom electrode assembly 13. To this end, the output of source 52 is coupled to match/tunable ground network 58 via voltage, current and phase angle sensor 60, as well as switches 62 and 64. Network 58 includes variable reactances having values that are preset to provide approximate matching between the output impedance of source 52 and the expected impedance of the plasma in region 8 for the frequency of source 52. Sensor 60 derives output signals indicative of the current flowing between source 52 and match/tunable ground network 58, the voltage between the output of source 52 and ground 58 and the phase angle between the sensed voltage and current. Sensor 60 supplies these current, voltage and phase angle signals to controller 66, which responds to them to control the frequency of source 52 to maintain a substantially precise impedance match between the output impedance of source 52 and the impedance of the plasma at the frequency of source 52 in a manner known to those skilled in the art. Additionally, if the frequency of source 52 is fixed, sensor 60 supplies these current, voltage and phase angle signals which responds to them to control the variable reactances of matching network 58 to maintain a substantially precise impendence match between the output impedence of source 52 and the impendence of the plasma at the frequency of source 52 in a manner known to those skilled in the art. The variable reactances of network 58, when matched, are approximately tuned to the frequency of source 52 to provide a low impedance path for the frequency of source 52 in both directions and a high impedance path for the frequencies of sources 54 and 56 so that the frequencies of sources 54 and 56 are substantially attenuated, i.e., rejected by network 58. As the frequency of source 52 changes in response to set point changes thereof by an operator, controller 66 correspondingly varies the reactances of network 58 to maintain the low impedance path for the frequency of source 52 and approximate matching between the source output impedance and the impedance of the plasma for the frequency of source 52.

It is usually desirable when source 52 drives electrodes 16 for electric fields at the frequency of source 52 to subsist between electrodes 16 and 36. To this end, electrode 36 is selectively connected to ground through switch 65 and bandpass filter 67, having a center frequency equal to the nominal frequency of source 52, as set by the operator. Consequently, current at the frequency of source 52 flows from electrode 36 to ground through filter 67 which has a large impedance to the frequencies of sources 54 and 56 and therefore substantially blocks current at the frequencies of sources 54 and 56. Under this circumstance, it is frequently desirable to connect electrodes 34 and 42 to DC and RF ground, a result achieved by controller 24 closing switches 69 and 71, respectively connected between electrodes 34 and 42 and ground. For other purposes, controller 24 grounds electrode 16 for RF and DC by closing switch 72, connected between electrode 16 and ground.

In normal operation while source 52 drives electrode 16, switches 62 and 64 are connected as illustrated. However, under other circumstances, while source 52 is decoupled from electrode 16, switches 62 and 64 are activated by controller 24 so that switches 62 and 64 respectively engage first terminals of resistors 68 and 70, both of which have values equal to the output impedance of source 52. The second terminals of resistors 68 and 70 are connected to ground so that when source 52 is decoupled from electrode 16, the output of source 52 drives a load matched to the output impedance of source 52. Under these conditions, the input terminals of network 58 are connected across resistors 70 so the impedance from electrode 16 looking back into the output terminals of network 58 is the same as when source 52 is coupled to electrode 16. In addition, because network 58 is tuned approximately to the frequency of source 58, network 58 provides a low impedance at the frequency of source 52 from electrode 16 through the tuned circuitry of network 58 to ground through resistor 70 and a high impedance at the frequency of sources 54 and 56 from electrode 16 through the tuned circuitry of network 58 to ground through resistor 70.

Mid frequency source 54, having a frequency F2, can drive (1) only electrode 16, (2) only electrode 36, (3) both electrodes 16 and 36 simultaneously, (4) only electrode 34, (5) only electrode 42, (6) both electrodes 34 and 36 simultaneously, (7) both electrodes 34 and 42 simultaneously, and (8) both electrodes 36 and 42 simultaneously.

To these ends, the output of source 54 is coupled to three position coaxial RF switch 74, having first and second output terminals selectively connected to drive match/tunable ground networks 76 and 78 at separate times. Networks 76 and 78 are identical to each other and similar to network 66, except that networks 76 and 78 provide matching and a tunable ground for the frequency of source 54. As such, networks 76 and 78 pass current and voltage at the frequency of source 54, but block current and voltage at the frequencies of sources 52 and 56. Switch 74 includes a third terminal connected to an input port of power splitter 80, having first and second output ports on which are derived oppositely phased power at the frequency of source 54. The power at the output ports of splitter 80 can be the same or different, depending upon the design and setting of the splitter; the setting of splitter 80 can be set manually by the operator or automatically by controller 24 in response to a recipe program a memory of the controller stores. Power at the first and second output ports of splitter 80 is respectively simultaneously supplied to networks 76 and 78. Power is supplied from the first output terminal of switch 74 or the first output terminal of splitter 80 to the input terminals of network 76 via voltage, current and phase angle sensor 82, as well as switches 84 and 86, respectively selectively connected to ground through resistors 88 and 90. Power is supplied from the second output terminal of switch 74 or the second output terminal of splitter 80 to the input terminals of network 78 via voltage, current and phase angle sensor 92, as well as switches 94 and 96, respectively connected to ground through resistors 98 and 100. Controllers 102 and 104 are respectively associated with networks 76 and 78, as well as sensors 82 and 92. Controllers 102 and 104 respond to the outputs of sensors 82 and 92 and operator inputs to control the values of the reactances of network 76 and 78 and the frequency of source 54 in the same manner as described supra for controller 66.

Three position coaxial RF switch 106 responds to control signals from controller 24 to selectively connect the output of network 76 to electrode 16 or electrode 34, or open circuit the output of network 76. Three position coaxial RF switch 108 operates in conjunction with switch 106 by responding to control signals from controller 24 to selectively connect the output of network 78 to electrode 36 or electrode 42, or open circuit the output of network 78. While controller 24 activates switch 74 to couple the output of source 54 to network 76, the controller activates switch 106 to connect the output of network 76 to either electrode 16 or electrode 34. If controller 24 causes the output of network 76 to be coupled to electrode 16 by causing switch 74 to engage the first output terminal of switch 74, the controller (1) opens switch 72 to prevent electrode 16 from being grounded and (2) either opens or closes switch 69 to decouple electrode 34 from ground or to ground electrode 34, respectively. If controller 24 causes the output of network 76 to be coupled to electrode 34 by causing switch 74 to engage the first output terminal of switch 74, the controller (1) opens switch 69 to prevent electrode 34 from being grounded and (2) either opens or closes switch 72 to decouple electrode 16 from ground or to ground electrode 16, respectively. If controller 24 causes the output of network 78 to be coupled to electrode 36 by causing switch 74 to engage the second output terminal of switch 74, the controller (1) opens switch 110 that RF and DC grounds electrode 36, when closed, and (2) either opens or closes switch 71 to decouple electrode 42 from ground or to ground electrode 42, respectively. If controller 24 causes the output of network 78 to be coupled to electrode 42 by causing switch 74 to engage the second output terminal of switch 74, the controller (1) opens switch 71 to decouple ground from electrode 42 and (2) either opens or closes switch 110 to decouple electrode 36 from ground or to ground electrode 36, respectively. If controller 24 activates switch 74 so that splitter 80 simultaneously supplies power to networks 76 and 78, controller 24 activates switches 69, 71, 72 and 110 to prevent any of electrodes 16, 34, 36 or 42 that are connected to the output terminals of network 76 and/or 78 from being grounded.

High frequency source 56, having a frequency F3, can drive (1) only electrode 16, (2) only electrode 36, (3) both electrodes 16 and 36 simultaneously, (4) only electrode 34, (5) only electrode 42, (6) both electrodes 34 and 36 simultaneously, (7) both electrodes 34 and 42 simultaneously, and (8) both electrodes 36 and 42 simultaneously.

To these ends, the output of source 56 drives circuitry that is identical to the circuitry that source 54 drives, except that the match/tunable ground networks 112 and 114 associated with source 56 are preset to be tuned to the nominal frequency of source 56 so networks 112 and 114 pass the current and voltage from source 56, but block the current and voltage of sources 52 and 54. Thus, the output of source 56 is coupled to three position coaxial RF switch 116, having first, second and third output terminals respectively connected to drive networks 112 and 114 and splitter 118, having first and second output terminals connected to drive input terminals of networks 112 and 114. The first output terminals of switch 116 and splitter 118 are selectively connected to the input terminals of matching network 112 via voltage, current and phase angle sensor 120, as well as switches 122 and 124, while the second output terminals of switch 116 and splitter 118 are selectively connected to the input terminals of matching network 114 via voltage, current and phase angle sensor 126, as well as switches 128 and 130. Switches 122, 124, 128 and 130 are respectively selectively connected to ground by resistors 131-134, each of which has a value equal to the output impedance of source 56. Controllers 136 and 138 are respectively associated with networks 112 and 114, as well as sensors 120 and 126, to control networks 112 and 114, as well as the frequency of source 56.

Controller 24 activates (1) three position coaxial switch 140 to selectively connect the output of network 112 to either electrode 16 or electrode 34 or to neither electrode 16 or electrode 34, and (2) three position coaxial switch 142 to selectively connect the output of matching network 114 to either electrode 36 or electrode 42 or to neither electrode 36 or electrode 42. Controller 24, in conjunction with activation of switches 116 and 142, activates switches 69, 72 and 110 to prevent any of electrodes 16, 34, 36 or 42 which are connected to the output terminals of networks 112 and 114 from being grounded, as described supra in connection with the circuitry associated with source 54.

Controller 24 activates the various switches of FIG. 2 to provide great versatility to the various combinations and permutations of the several frequencies that can be applied to electrodes 16, 34, 36 and 42. For example, the low, medium and high frequencies of sources 52, 54 and 56 can be simultaneously applied to electrode 16 while switches 69, 71 and 110 are closed to ground electrodes 34, 36 and 42. Under these circumstances, different portions of the energy at each of the frequencies of sources 52, 54 and 56 is shunted to ground in plasma confinement region 8, as a result of electric field coupling from electrode 16 to the ground potential of electrodes 34, 36 and 42. The amount of energy at each of frequencies F1, F2 and F3 coupled from electrode 16 to the ground potential of electrodes 34, 36 and 42 is a function of (1) the wavelength associated with each of the three frequencies, (2) the distance between electrodes 16 and 36, (3) the distance between electrodes 16 and 34, and (4) the distance between electrodes 36 and 42. The distances between the various combinations of electrodes in chamber 10 are controlled by the geometry of the electrodes and by motor 47, inter alia.

A second exemplary situation involves applying the low and medium frequencies to bottom electrode 16, while applying the high frequency to top electrode 36, while grounding electrodes 34 and 42 and closing switch 65 so a low impedance path is provided through bandpass filter 67 for only the low frequency from electrode 36 to ground. In addition, switches 96 and 142 are activated to connect electrode 36 to the output terminal of network 78 and the input terminal of network 78 to ground through resistor 100, resulting in a low impedance path to ground through network 78 from electrode 36 for the mid-frequency of source 54. Because of the high frequency of source 56 and relatively close spacing between electrodes 36 and 42, the electric field at the high frequency has a tendency to remain primarily in the upper portion of region 8 to provide a relatively large electric field density for dissociation purposes to the gas flowing from source 37 into region 8. The electric field at the high frequency does not have a tendency to be coupled to electrode 16 because there is no low impedance path at the high frequency from electrode 16 to ground. Networks 58 and 76 are effectively bandpass filters for the low and medium frequencies that reject current at the high frequency. Because networks 58 and 76 have a high impedance to the high frequency, networks 58 and 76 decouple the high frequency from electrode 16.

In contrast to the electric field associated with high frequency F3, the electric field associated with the low frequency F1 of source 52 extends from electrode 16 to (1) electrode 34, (2) electrode 36 and (3) electrode 42. The resulting current at frequency F1 in electrode 36 flows through the low impedance path of filter 67 to ground. Consequently, the electric field associated with frequency F1 affects ion energy throughout region 8.

The electric field associated with medium frequency F2 of source 54 extends primarily from electrode 16 to electrode 34, as well as to electrode 36, and to a lesser extent to electrode 42. The resulting current at frequency F2 in electrode 36 flows through the low impedance path of network 78 to ground via switches 108 and 96 and resistor 100.

A third exemplary situation involves applying the low and medium frequencies to bottom electrode 16 and the medium frequency to top electrode 36 while grounding electrodes 34 and 42 and closing switch 65 so a low impedance path is provided for only the low frequency from electrode 36 to ground through bandpass filter 67. Thereby, the low frequency of source 52 is coupled to the plasma in region 8 in the same manner as described supra for the second exemplary situation. The high frequency of source 56 is not a factor for the third exemplary situation because controller 24 causes switches 140 and 142 to engage the open circuited terminals thereof. The medium frequency of source 54 is coupled to electrodes 16 and 36 by virtue of switch 74 engaging its third output terminal so that splitter 80 is responsive to power from source 54. Controller 24 activates switches 106 and 108 so that the outputs of networks 76 and 78 respectively drive electrodes 16 and 36. Consequently, electric fields at the medium frequency are coupled between (1) electrodes 16 and 36, (2) electrodes 16 and 34, and (3) electrodes 36 and 42. As a result, electric fields at the medium frequency affect ion energy, plasma density and molecular dissociation throughout region 8.

A fourth exemplary situation involves applying the low frequency to electrode 16 and the medium and high frequencies to electrode 36, while electrodes 34 and 42 are grounded. In this situation, controller 24 activates (1) switches 74 and 116 to the second positions thereof, (2) switches 108 and 142 so the output terminals of network 78 and 114 are connected to electrode 36, (3) switches 94 and 96 so the input terminals of network 78 are connected to sensor 92, (4) switches 128 and 130 so the input terminals of network 114 are connected to sensor 126, (5) switches 106 and 140 so the output terminals of networks 76 and 112 are respectively connected to electrode 16 and open circuited, and (6) switches 86 and 124 so the input terminals of networks 76 and 112 are connected to ground through resistors 90 and 132, respectively. Consequently, the low frequency of sources 52 has a low impedance path from electrode 36 to ground through bandpass filter 67, but the frequencies of sources 54 and 56 do not have such low impedance paths from electrode 36 to ground. As a result, the low frequency of source 52 is coupled to the plasma in region 8 in the same manner as described supra for the second exemplary situation. Low impedance paths exist from the output terminals of network 78 through switch 108 to electrode 36, thence through the plasma in region 8 to (1) electrode 16 to ground through network 76, switch 86 and resistor 98 and (2) electrode 42 to ground. Consequently, substantial electric fields at the medium frequency are in region 8 between electrodes 36 and 42, as well as between electrodes 16 and 36. As a result, there is primary control of ion distribution in the upper portion of region 8, as well as across the center portion of region 8 between electrodes 16 and 36. The only low impedance path for the high frequency of source 56 for this situation is between electrodes 36 and 42. There is no low impedance path between electrodes 16 and 36 for the high frequency of source 56 because electrode 16 is decoupled from the output terminals of network 112 by virtue of switch 140 being open circuited. The spacing between electrodes 36 and 34 for the high frequency of source 56 is such that the impedance for the high frequency through the plasma between electrodes 34 and 36 is substantially greater than the impedance between electrodes 36 and 42. Consequently, the high frequency of source 56 affects the plasma in region 8 in the same manner as described supra for the second exemplary situation.

In a fifth exemplary situation, the low and medium frequencies of sources 52 and 54 are applied to bottom electrode 16, while each of electrodes 34, 36 and 42 is grounded. To this end, controller 24 activates switch 106 to connect the output of network 76 to electrode 16, while closing each of switches and 69, 71 and 110. The plasma in region 8 is thereby affected by the low and medium frequencies of sources 52 and 54 in the same way as described for the low and medium frequencies for the first exemplary situation. The plasma in region 8 is not affected by the high frequency of source 56 for the same reasons set forth in the third exemplary situation.

In other exemplary situations, controller 24 can control the various switches of FIG. 2 so only the low frequency of source 52 is connected to electrode 16 and neither source 54 nor source 56 is connected to any of the electrodes. In such a situation, controller 24 closes switch 110 and chamber 10 processes the workpiece in a somewhat primitive manner. Alternatively, controller 24 can connect the output of either or both of sources 54 and 56 to any of electrodes 16, 34, 36 or 42. For example, it may be desirable to couple the high frequency of source 56 between electrodes 16 and 36, while coupling the medium frequency of source 54 between electrodes 36 and 34. In such a situation, controller 24 (1) opens switches 69, 71, 72 and 110, (2) activates switches 74, 94 and 96 and switches 116, 128 and 130 so the outputs of sources 54 and 56 are respectively applied to input terminals of networks 78 and 114, (3) activates switches 108 and 142 so the outputs of networks 78 and 114 are connected to electrode 36, (4) activates switches 106 and 86 so there is a low impedance path from electrode 34 to ground through network 76 and resistor 94 for the medium frequency of source 54, and (5) activates switches 140 and 124 so there is a low impedance path from electrode 16 to ground through network 112 and resistor 132 for the high frequency of source 56. Consequently, electric fields are established in region 8 for (1) only the high frequency of source 56 between electrodes 16 and 36 and (2) only the medium frequency of source 54 between electrodes 34 and 36. Because there is no low impedance path to ground from electrode 16 for the medium frequency of source 54 there is no substantial electric field established in region 8 between electrodes 16 and 36 for the medium frequency. Because there is no low impedance path to ground from electrode 34 for the high frequency of source 56 there is no substantial electric field for the high frequency established in region 8 between electrodes 34 and 36. It is also to be understood that suitable bandpass filter circuitry similar to that described and illustrated can be employed for providing a low impedance path between electrodes 36 and 42 only for the high frequency of source 56.

Figure 3:
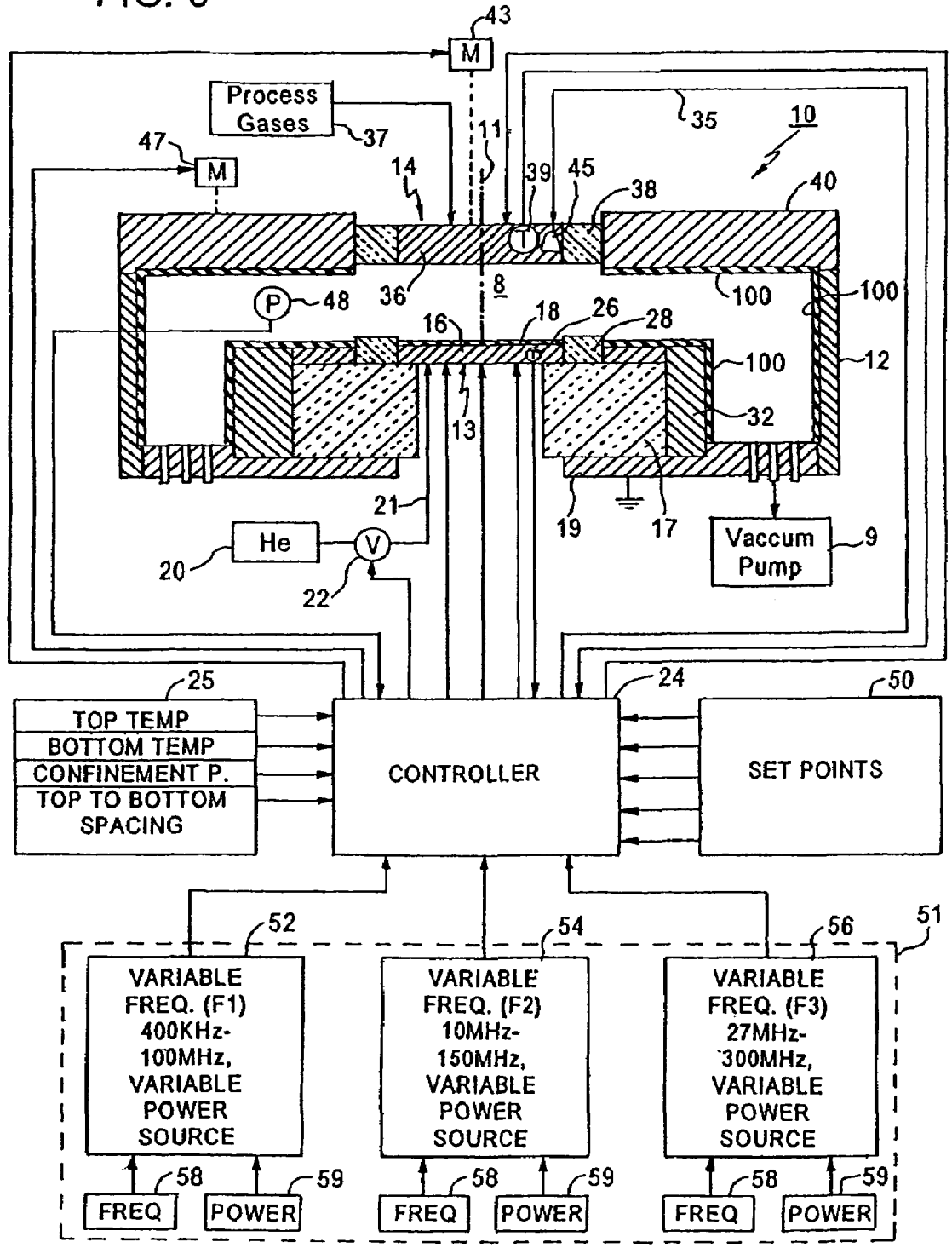
FIG. 3 is a partially schematic diagram of a vacuum plasma processor in accordance with another embodiment of the present invention.

Reference is now made to FIG. 3 of the drawing, a schematic diagram of a second embodiment of chamber 10. The embodiment of FIG. 3 is similar to the embodiment of FIG. 1, but the embodiment of FIG. 3 has a much larger volume plasma confinement region that extends to chamber wall 12 and base 19. Consequently, the embodiment of FIG. 3 does not include louvers 44 and the pressure of the plasma processing workpiece 18 is controlled exclusively by using pressure control for vacuum pump 9. The entire bottom face of metal ring 40, the side wall of ring 32 and the interior surface of side wall 12 are all grounded and define parts of the boundary of the plasma confinement region in the embodiment of FIG. 3. To prevent chemical contamination by the plasma of any of the bottom face of metal ring 40, the side wall of ring 32 or the interior surface of side wall 12, all of these surfaces are covered with plates 100 made of an electrically conductive or dielectric material, such as intrinsic silicon, that does not contaminate the chemistry of the plasma in region 8. Because side wall 12 is part of the plasma confinement region in the embodiment of FIG. 3, the temperature of the side wall is controlled in a manner similar to that described for control of electrode assembly 14 in the embodiment of FIG. 1.

The electrodes in the embodiment of FIG. 3 are responsive to several RF frequencies and controlled as described supra in connection with FIGS. 1 and 2. The electric fields in the chamber of FIG. 3 differ considerably from the electric fields in the chamber of FIG. 1 because of the large volume and complex shape of the plasma confinement region in the FIG. 3 embodiment. However, the electric field effects on the plasma are somewhat similar in the embodiment of FIG. 3 to those described in connection with the embodiment of FIGS. 1 and 2.

While there have been described and illustrated specific embodiments of the invention, it will be clear that variations in the details of the embodiments specifically illustrated and described may be made without departing from the true spirit and scope of the invention as defined in the appended claims. For example, while the circuitry of FIG. 2 indicates that the outputs of sources 52, 54 and 56 are simultaneously and continuously supplied to electrodes 16 and/or 36 during processing of the workpiece, it is to be understood that at least one of sources 52, 54 and/or 56 can be pulsed on and off.

We claim:

1. A vacuum plasma processor comprising a vacuum chamber including an electrode, the chamber being associated with a reactance, the electrode and reactance being arranged for coupling plasma excitation fields to gas in the chamber, the chamber being arranged for carrying a workpiece while the plasma excitation fields are coupled to the plasma, and a plasma excitation source arrangement having a set of frequencies comprising three frequencies, the source arrangement being arranged for enabling the electrode to couple the electric energy at the frequencies of the set to the plasma incident on the workpiece, the plasma excitation source arrangement being arranged for applying the frequencies of the set to the electrode, the frequencies of the set being such that the excitation of the plasma by frequencies of the set simultaneously causes different phenomena to occur in the plasma, wherein the phenomena affect plasma ion energy, plasma ion density and plasma chemistry of the plasma incident on the workpiece.

2. The vacuum plasma processor of claim 1 wherein the plasma excitation source arrangement is arranged for causing the set of frequencies to be simultaneously applied to the plasma.

3. The vacuum plasma processor of claim 1 wherein the electrode for carrying the workpiece includes a first electrode in the chamber and the reactance includes a second electrode in the chamber.

4. The vacuum plasma processor of claim 3 wherein the plasma excitation source arrangement is arranged for selectively applying, at different operating time periods of the processor, (a) a plurality of the frequencies of the set to the first electrode and at least one of the frequencies, that differs from the plurality of frequencies, to the second electrode, and (b) the frequencies of the set to the first electrode.

5. The vacuum plasma processor of claim 3 wherein the first and second erectrodes and the source arrangement are arranged for causing the second electrode to be at a reference potential and for simultaneously causing the source arrangement to apply the frequencies of the set to the first electrode.

6. The processor of claim 3 wherein a first of the frequencies is in the range of 100 kHz to 10 MHz, a second of the frequencies is in the range of 10 MHz to 150 MHz, and a third of the frequencies is in the range of 27 MHz to 300 MHz.

7. The processor of claim 6 wherein the plasma excitation source arrangement is arranged for selectively simultaneously applying the first and second frequencies to the first electrode while applying the third frequency to the second electrode.

8. The processor of claim 7 wherein the plasma excitation source arrangement is arranged for simultaneously applying the first, second, and third frequencies to the first electrode while the second electrode is at a reference potential.

9. The vacuum plasma processor of claim 1 wherein the plasma excitation source arrangement includes at least one variable frequency RF source.

10. The vacuum plasma processor of claim 1 wherein the plasma excitation source arrangement includes circuitry for (a) providing an impedance match between sources of the frequencies and the plasma and (b) decoupling the frequencies associated with the different sources from each of the other sources.

11. A vacuum plasma processor for a workpiece comprising a vacuum chamber including first and second electrodes for supplying plasma excitation fields to a region of the chamber adapted to be responsive to gas adapted to be converted into a plasma for processing the workpiece, the chamber being arranged for carrying the workpiece while the plasma exciting fields are supplied to the region, a plasma excitation source arrangement having a set of frequencies, the set of frequencies including three frequencies, the plasma source arrangement being arranged for deriving electric energy at the set of frequencies, the plasma excitation source arrangement including circuitry for coupling the frequency of the set to the first electrode for enabling plasma exciting electric fields at the frequency of the set to be coupled to the plasma.

12. The processor of claim 11 wherein the circuitry is arranged for selectively coupling a plurality of the frequencies of the set to the first electrode and for selectively coupling at least one of the frequencies of the set to the second electrode, the at least one frequency being different from the plurality of frequencies, the circuitry being arranged so the frequencies of the set are applied to the first electrode during a first operating time period of the processor that is different from a second operating time period of the processor while the plurality of the frequencies of the set are applied to the first electrode and at least one of the frequencies of the set is applied to the second electrode.

13. The processor of claim 11 wherein the circuitry is arranged for (a) providing an impedance match between sources of the frequencies of the set and the plasma and (b) decoupling the frequencies associated with the different sources from each of the other sources.

14. The processor of claim 11 wherein the plasma excitation source arrangement includes different frequency sources, one for each frequency of the set.

15. The processor of claim 14 wherein at least one of the sources has a variable frequency.

16. The processor of claim 14 wherein at least one of the sources has a fixed frequency.

17. The processor of claim 14 wherein various combinations of the frequencies of the set affect (a) the density of the plasma, (b) the energy of ions in the plasma, and (C) the chemistry of the plasma.

18. The processor of claim 14 wherein at least one of the sources has a variable output power.

19. The processor of claim 11 wherein the circuitry and the chamber are arranged for preventing substantial current to flow at at least one of the plurality of frequencies of the set to the second electrode.

20. The processor of claim 11 wherein the circuitry is arranged for connecting the second electrode to a reference potential and for supplying the frequencies of the set to the first electrode.

21. The processor of claim 11 wherein the circuitry is arranged for supplying the same frequency to the first and second electrodes.

22. The processor of claim 11 wherein the plasma source arrangement circuitry is arranged for simultaneously coupling the three or more frequencies of the set to the electrodes.

23. The vacuum plasma processor of claim 11 wherein the plasma excitation source arrangement is arranged for applying the frequencies of the set to the first electrode.

24. The vacuum plasma processor of claim 11 wherein the first and second electrodes and the source arrangement are arranged for causing the second electrode to be at a reference potential and for simultaneously causing the source arrangement to apply the frequencies of the set to the first electrode.

25. The processor of claim 11 wherein a first of the frequencies is in the range of 100 kHz to 10 MHz, a second of the frequencies is in the range of 10 MHz to 150 MHz, and a third of the frequencies is in the range of 27 MHz to 300 MHz.

26. A vacuum plasma processor for a workpiece comprising a vacuum chamber including first and second electrodes for supplying plasma excitation fields to a region of the chamber adapted to be responsive to gas adapted to be converted into a plasma for processing the workpiece, the chamber being arranged for carrying the workpiece while the plasma exciting fields are supplied to the region, a plasma excitation source arrangement having a set of frequencies comprising three frequencies, the plasma excitation source arrangement including circuitry for selectively enabling coupling of the set of frequencies to at least one of the first and second electrodes for enabling plasma exciting electric fields at the set of frequencies to be coupled to the plasma, the circuitry and the chamber being arranged for preventing substantial current to flow at said at least one of the frequencies of the set to the second electrode; the circuitry and the chamber arrangement for preventing the substantial current to flow including; (a) a surface in the chamber at a reference potential for causing current to flow at said at least one of the frequencies of the set from the first electrode to the surface and (b) a filter arrangement of the circuitry, the filter arrangement being connected to the second electrode for preventing the substantial flow of current at said at least one of the plurality of frequencies between the second electrode and the reference potential.

27. A vacuum plasma processor for a workpiece comprising a vacuum chamber including first and second electrodes for supplying plasma excitation fields to a region of the chamber adapted to be responsive to gas adapted to be converted into a plasma for processing the workpiece, the chamber being arranged for carrying the workpiece while the plasma exciting fields are supplied to the region, a plasma excitation source arrangement for deriving electric energy at a set of frequencies, the set of frequencies comprising three frequencies, the plasma excitation source arrangement including circuitry for selectively enabling coupling of the frequencies of the set to at least one of the first and second electrodes for enabling plasma exciting electric fields at the frequencies of the set to be coupled to the plasma, the circuitry and the chamber including a controller for selectively connecting the second electrode to a reference potential during a first workpiece processing time period and for selectively supplying the same frequency to the first and second electrodes during a second work piece processing time period.

28. The processor of claim 27 wherein the controller is arranged for selectively connecting the first electrode to be responsive to each of the frequencies of the set during the first time period.

29. A vacuum plasma processor for processing a workpiece comprising a vacuum chamber including an electrode arrangement for supplying plasma excitation fields to a region of the chamber adapted to be responsive to gas adapted to be converted into a plasma for processing the workpiece, the chamber being arranged for carrying the workpiece while the plasma excitation fields are supplied to the region, the electrode arrangement including first and second electrodes respectively on opposite first and second sides of the region and a third electrode on said first side of the region, the third electrode being peripheral to and electrically insulated from the first electrode, a plasma excitation source arrangement for deriving electric energy at plural frequencies, the plasma excitation source arrangement being arranged for selectively coupling energy at the plural frequencies to the first, second and third electrodes for causing current at at least one of the plural frequencies to flow in the third electrode without current at all of the frequencies flowing in the third electrode.

30. The processor of claim 29 wherein the electrode arrangement includes a fourth electrode on said second side of the region, the fourth electrode being peripheral to and electrically insulated from the second electrode, the plasma excitation source arrangement being arranged for selectively coupling energy to the fourth electrode for causing current at at least one of plural frequencies to flow in the fourth electrode without current at all the frequencies flowing through the fourth electrode.

31. The processor of claim 30 wherein the plasma excitation source arrangement is arranged for applying energy at at least one of the frequencies to the third electrode.

32. The processor of claim 30 wherein the plasma excitation source arrangement is arranged for applying energy at at least one of the frequencies to the fourth electrode.

33. The processor of claim 30 wherein the plasma excitation source arrangement is arranged for applying energy at at least one of the frequencies to the third and fourth electrodes.

34. The processor of claim 30 wherein the plasma excitation source arrangement includes a filter arrangement for enabling current at least one of the frequencies to flow between the third electrode and a reference potential while preventing current at at least one of the frequencies from flowing between the third electrode and the reference potential.

35. The processor of claim 30 wherein the plasma excitation source arrangement includes a filter arrangement for enabling current at at least one of the frequencies to flow between the fourth electrode and a reference potential while preventing current at at least one of the frequencies from flowing between the fourth electrode and the reference potential.

36. The processor of claim 35 wherein the plasma excitation source arrangement includes a filter arrangement for enabling current at at least one of the frequencies to flow between the third electrode and a reference potential while preventing current at at least one of the frequencies from flowing between the third electrode and the reference potential.

37. The processor of claim 29 wherein the plasma excitation source arrangement is arranged for applying energy at at least one of the frequencies to the third electrode.

38. The processor of claim 29 wherein the plasma excitation source arrangement includes a filter arrangement for enabling current at at least one of the frequencies to flow between the third electrode and a reference potential while preventing current at at least one of the frequencies from flowing between the third electrode and the reference potential.

39. A vacuum plasma processor comprising a vacuum chamber including therein a first electrode and a second electrode, the first and second electrodes being arranged for coupling plasma excitation fields to gas in the chamber, the chamber being arranged for carrying a workpiece while the plasma excitation fields are coupled to the plasma, and a plasma excitation source arrangement for enabling the first and second electrodes to couple the electric energy at a set of frequencies to the plasma incident on the workpiece, the set of frequencies comprising three frequencies, wherein the plasma excitation source arrangement is arranged for simultaneously applying first, second, and third frequencies of the set to the first electrode while the second electrode is at a reference potential, the first of the frequencies being in the range of 100 kHz to 10 MHz, the second of the frequencies being in the range of 10 MHz to 150 MHz, and the third of the frequencies being in the range of 27 MHz to 300 MHz.

40. The vacuum plasma processor of claim 39 wherein the plasma excitation source arrangement is arranged for causing the three or more frequencies to be simultaneously applied to the plasma.

41. The processor of claim 39 wherein the plasma excitation source arrangement is arranged for simultaneously applying the first and second frequencies to the first electrode while applying the third frequency to the second electrode the source arrangement being arranged so that during first operating time periods of the processor on the first electrode is at the reference potential and during the second operating time periods of the processor the third frequency is applied to the second electrode.

42. The vacuum plasma processor of claim 39 wherein the plasma excitation source arrangement is arranged for selectively applying a plurality of the frequencies of the set to the first electrode and at least one of the frequencies of the set, that differs from the plurality of frequencies, to the second electrode.

43. The vacuum plasma processor of claim 39 wherein the plasma excitation source arrangement includes at least one variable frequency RF source.

44. The vacuum plasma processor of claim 39 wherein the plasma excitation source arrangement includes circuitry for (a) providing an impedance match between sources of the frequencies and the plasma and (b) decoupling the frequencies associated with the different sources from each of the other sources.

45. The vacuum plasma processor of claim 39 wherein the excitation source arrangement is arranged and the frequencies have values for causing three or more different phenomena to occur simultaneously in the plasma.

* * * * *